(12) United States Patent
Suzuki et al.

(10) Patent No.: US 6,515,470 B2
(45) Date of Patent: Feb. 4, 2003

(54) METHOD AND APPARATUS FOR TESTING IC DEVICE

(75) Inventors: Tetsuya Suzuki, Honjou (JP); Akira Okitsu, Honjou (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/802,914

(22) Filed: Mar. 12, 2001

(65) Prior Publication Data

US 2002/0026258 A1 Feb. 28, 2002

(30) Foreign Application Priority Data

Mar. 16, 2000 (JP) .......................................... 2000-074694

(51) Int. Cl.[7] ............................. G01R 1/04; G01R 31/02
(52) U.S. Cl. ........................ 324/158.1; 324/754; 324/760
(58) Field of Search ............................. 324/158.1, 754, 324/755, 760, 765; 414/404, 416, 222.01, 222.07, 222.08, 331.13, 331.14, 788.7, 796

(56) References Cited

U.S. PATENT DOCUMENTS

| | | | | | |
|---|---|---|---|---|---|
| 4,103,232 A | * | 7/1978 | Sugita et al. | ............... | 324/754 |
| 5,148,100 A | * | 9/1992 | Sekiba | ........................ | 324/765 |
| 5,150,797 A | * | 9/1992 | Shibata | ........................ | 209/573 |
| 5,184,068 A | * | 2/1993 | Twigg et al. | ............... | 324/755 |
| 5,307,011 A | * | 4/1994 | Tani | ........................ | 324/185.1 |
| 5,313,156 A | * | 5/1994 | Klug et al. | ............... | 324/185.1 |
| 5,788,084 A | * | 8/1998 | Onishi et al. | ............ | 324/158.1 |
| 5,812,409 A | * | 9/1998 | Kanno et al. | ............ | 324/158.1 |
| 6,034,524 A | * | 3/2000 | Barringer et al. | ........ | 324/158.1 |
| 6,104,183 A | * | 8/2000 | Kobayashi et al. | ...... | 324/158.1 |
| 6,163,145 A | * | 12/2000 | Yamada et al. | .......... | 324/158.1 |
| 6,198,273 B1 | * | 3/2001 | Onishi et al. | ............ | 324/158.1 |
| 6,225,798 B1 | * | 5/2001 | Onishi et al. | ............ | 324/158.1 |

* cited by examiner

Primary Examiner—Michael Sherry
Assistant Examiner—Jermele Hollington
(74) Attorney, Agent, or Firm—Oblon, Spivak, McClelland, Maier & Neustadt, P.C.

(57) ABSTRACT

For testing electrical properties of packaged IC devices, there is provided an apparatus which includes a test board which is located at a testing station and provided with a plural number of contacting sockets for connecting individual IC devices to an IC tester separately and independently of each other, a loader which is located at a loading station and adapted to feed untested IC devices toward the test board, an unloader which is located at an unloading station and adapted to discharge tested IC devices from the test board at the testing station, and a device transfer mechanism which is movable across the testing station to transfer untested IC devices from the loader to the test board and also to transfer tested IC devices from the test board to the unloader. Upon detecting completion of a test on one of IC devices in one socket of the test board, a fresh untested IC device is transferred to the testing station to replace the tested IC device. As soon as the fresh IC device is set in position in that socket, execution of a test program is started with respect to that socket on the test board.

5 Claims, 8 Drawing Sheets

METHOD AND APPARATUS FOR TESTING IC DEVICE

BACKGROUND OF THE INVENTION

1. Field of the Art

This invention relates to a method and an apparatus for testing electrical properties of IC devices, particularly suitable for use in testing packaged IC devices such as, for example, EEPROM (Electrically Erasable Programmable ROM) and the like.

2. Prior Art

Generally, apparatus which are in use for testing electrical properties of packaged IC devices are largely constituted by an IC tester and an IC handler. An IC tester is arranged to check for defects of IC devices by measuring electrical properties of connected IC devices according to predetermined test patterns. On the other hand, an IC handler is arranged to electrically connect respective IC devices to the IC tester, and to classify tested IC devices according to test results.

Accordingly, the IC handler which is generally employed for connecting and disconnecting IC devices to and from the IC the IC tester is largely constituted by a test board for removably mounting IC devices thereon, a loader for feeding IC devices to the test board, an unloader for sorting out tested IC devices according to test results, and a transfer means for transferring IC devices from the loader to the test board and then from the test board to the unloader.

Normally, an IC device testing apparatus is arranged to test a plural number of IC devices simultaneously. Therefore, the test board is usually provided with a large number of contact portions, for example, 32, 64 or 128 contact portions which are arranged in arrayed in a matrix-like fashion. A large number of IC devices are set on the contact portions of a test board by a transfer means and set on an IC tester to test electrical properties of individual IC devices simultaneously.

For instance, in handling IC devices, it is the usual practice to use, as a container jig, a tray which is arranged to hold a large number of IC devices. A number of such trays are stacked on the loader, and IC devices are picked up therefrom one after another by the transfer means. Tested IC devices are sent to the unloader. At the unloader, IC devices are sorted according to test results, for example, into a qualified group and a disqualified group. As for an IC device container jig for use at the unloader, it is also the usual practice to employ trays which are similar in construction to the trays which are used at the loader. Further, generally the IC transfer means is constituted by a robot which is provided with suction gripper means for gripping package portions of IC devices. Furthermore, normally the IC loader and unloader are located in positions distant from a testing station. Therefore, IC devices need to be transferred from the loader to the test position and then from the test position to the unloader. For this purpose, an IC transfer means is provided between the loader and the test position and also between the test position and the unloader. For transfer of IC devices, the above-mentioned trays or other transfer jigs can be used as carriers. Alternatively, a test board can be used as a carrier fro IC devices if desired.

IC devices are tested not only under normal temperature conditions but also heated and cooled temperature conditions. For this purpose, IC devices are put in a constant temperature oven or a thermostatic chamber which can create predetermined temperature conditions, and a testing head of the tester is located within the thermostatic chamber. Prior to a test, IC devices are preheated within the thermostatic chamber. More particularly, IC devices are left in a thermostatic chamber for a predetermined time period to heat or cool them to a specified temperature before connection to a testing head.

Accordingly, in a case where a test board is used as a transfer jig, it has been the general practice to transfer the test board from the loader to the unloader through the thermostatic chamber and then return it to the loader, moving the test board cyclically to and from the loader and unloader. While being transferred on the test board, IC devices are heated or cooled to a predetermined temperature before the test board is disconnectibly connected to an interface board which is connected to the IC tester.

By the using an apparatus which is arranged as described above, a large number of IC devices can be tested simultaneously in an efficient manner. In addition, concurrently with a test on a number of IC devices, other succeeding or preceding IC devices are transferred to or from another test board at the loader and unloader and preheated on the way to the IC tester. Thus, the apparatus is arranged to test a large number of IC devices in a short period of time, by handling a plural number of IC devices concurrently in the respective stages.

Regarding integrated circuit devices, there are in use a large variety of IC devices which differ from each other in function, and each one of such IC device needs to be tested for electrical properties. For example, in the case of DRAM (Dynamic Random Access Memory), IC devices are tested by relatively simple patterns, which take almost uniform time in testing electrical properties of each IC device. It follows that a large number of IC devices which are mounted on a test board can be tested simultaneously by the same test program.

However, depending upon the types of IC devices, the test time can differ from one IC device to another. For instance, in the case of EEPROM, it is necessary to carry out a two-stage test on each IC device using a different pattern in each stage, i.e., to carry out a data write-in test in a first stage and a data erasure test in a second stage. In such a case, however, you cannot be sure if you can succeed in a data write-in test by one write-in action. Normally, the write-in action has to be repeated for a plural number of times. Besides, even among IC devices of the same type, a data write-in action may have to be repeated for a different number of times until succeeding in writing data in memory cells at a plural number of addresses. In the data write-in test, an IC device is judged as "qualified" when a set of data is successfully written into all of necessary memory cells at each address for a required number of times. The same applies to the data erasure test. Namely, in the data erasure test, an IC device is judged as "qualified" when data in all of memory cells are erased within a required number of times.

As described above, when testing IC devices such as EEPROM or the like, the testing time can vary largely from one IC device to another. In some cases, as compared with a shortest testing time, it may take a several to ten and several times longer testing time in finishing a test on some IC devices. Accordingly, when testing a large number of IC devices simultaneously in the manner as in the above-described prior art, the time duration of each test cycle needs to be extended according to those IC devices which would require the longest testing time. As a consequence, the testing time could become extremely long, making it difficult to test a large number of IC devices in speedy and efficient manner. These irregularities in testing time among the respective test boards greatly affect the progress of operations in other stages, i.e., the operations in the IC device loading, unloading and preheating stages.

SUMMARY OF THE INVENTION

In view of the foregoing situations, it is an object of the present invention to provide a method and an apparatus which make it possible to test IC devices smoothly and in an extremely efficient manner despite differences in testing time between individual IC devices.

In order to achieve the above-stated objective, according to the present invention, there is provided an apparatus for successively testing electrical properties of a large number of packaged IC devices, basically including a test board provided at a testing station and provided with a plural number of contacting sockets for receiving therein a plural number of IC devices for connection to an IC tester separately and independently of each other, a loader located at a loading station and adapted to feed untested IC devices toward the test board, an unloader located at an unloading station and adapted to discharge tested IC devices from the test board at the testing station, and a device transfer mechanism movable across the testing station to transfer untested IC devices from the loader to the testing station and to transfer tested IC devices from; the testing station to the unloader, the apparatus comprising: a detection means adapted to detect completion of an IC test conducted on an IC device in each socket of the test board; a means for operating the device transfer means in such a way as to pick up a tested IC device from the socket and replace same by a fresh IC device yet to be tested; and a means for detecting placement of the fresh IC device in the socket of said test board.

According to the present invention, there is also provided a method for successively testing electrical properties of a large number of packaged IC devices, comprising the steps of: successively picking up untested IC devices fed from a loading station by means of a device transfer mechanism and thereby feeding said IC devices successively to a plural number of contacting sockets on a test board of a testing station for connection to an IC tester; conducting a test on each one of the IC devices in the contacting sockets in the testing station concurrently and independently of each other; detecting completion of a test at each socket separately; upon detecting completion of a test at a socket, replacing a tested IC device in that socket by an untested fresh IC device by means of the device transfer mechanism; and upon detecting placement of the fresh IC device in said socket, starting again a test at that socket.

The above and other objects, features and advantages of the present invention will become apparent from the following particular description, taken in conjunction with the accompanying drawings which show by way of example a preferred embodiment of the invention. Needless to say, the present invention should not be construed as being limited particular forms shown in the drawings.

DESCRIPTION OF PREFERRED EMBODIMENTS

Hereafter, the present invention is described more particularly by way of its preferred embodiments. In the following description, the present invention is applied to testing of packaged IC devices under preheated or cooled conditions. However, it is to b e understood that the invention can be similarly applied to tests of similar IC devices at normal temperature.

Figure 1:
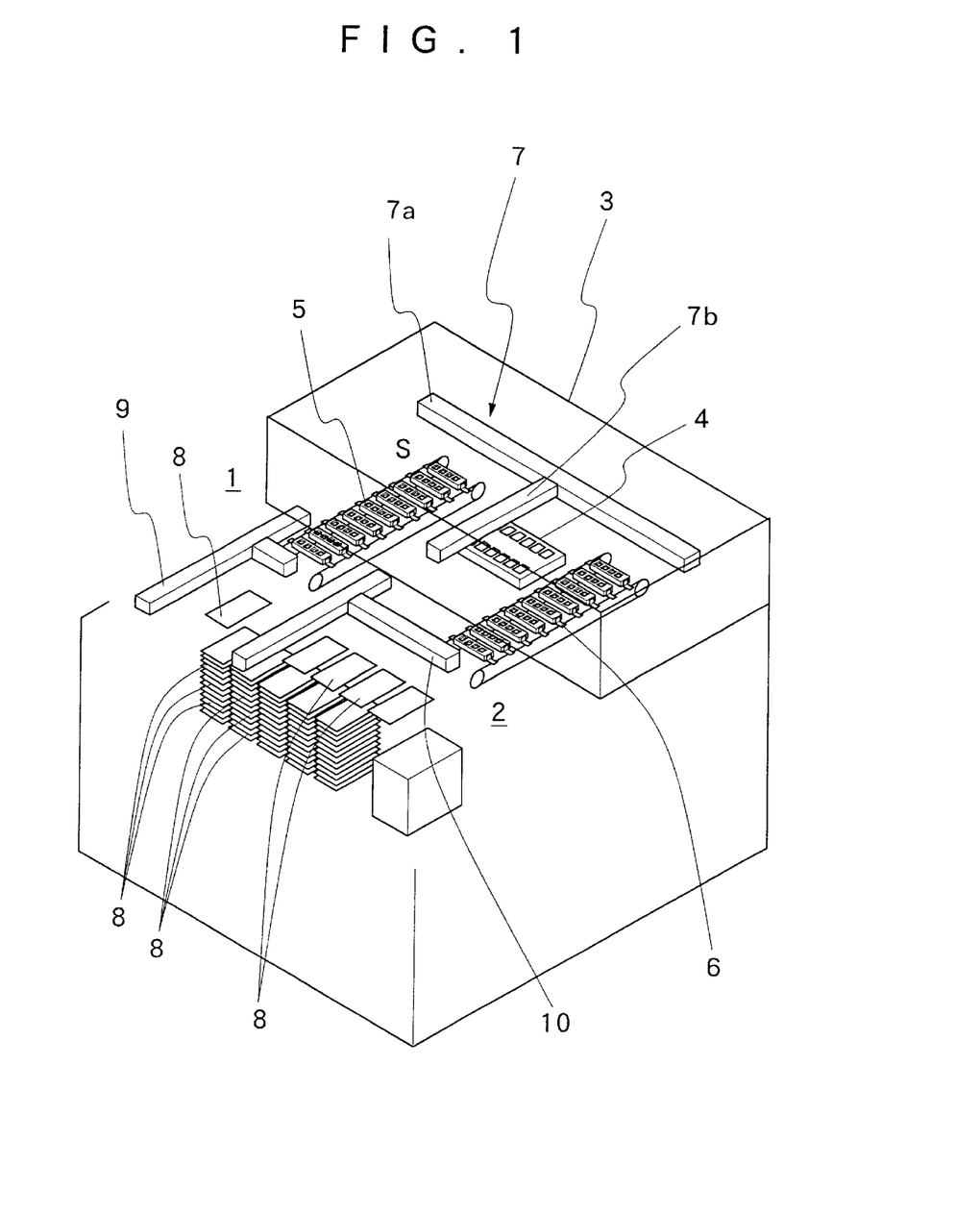
FIG. 1 is a schematic perspective view of an IC device testing apparatus according to the present invention, showing the general layout of the apparatus.
Figure 2:
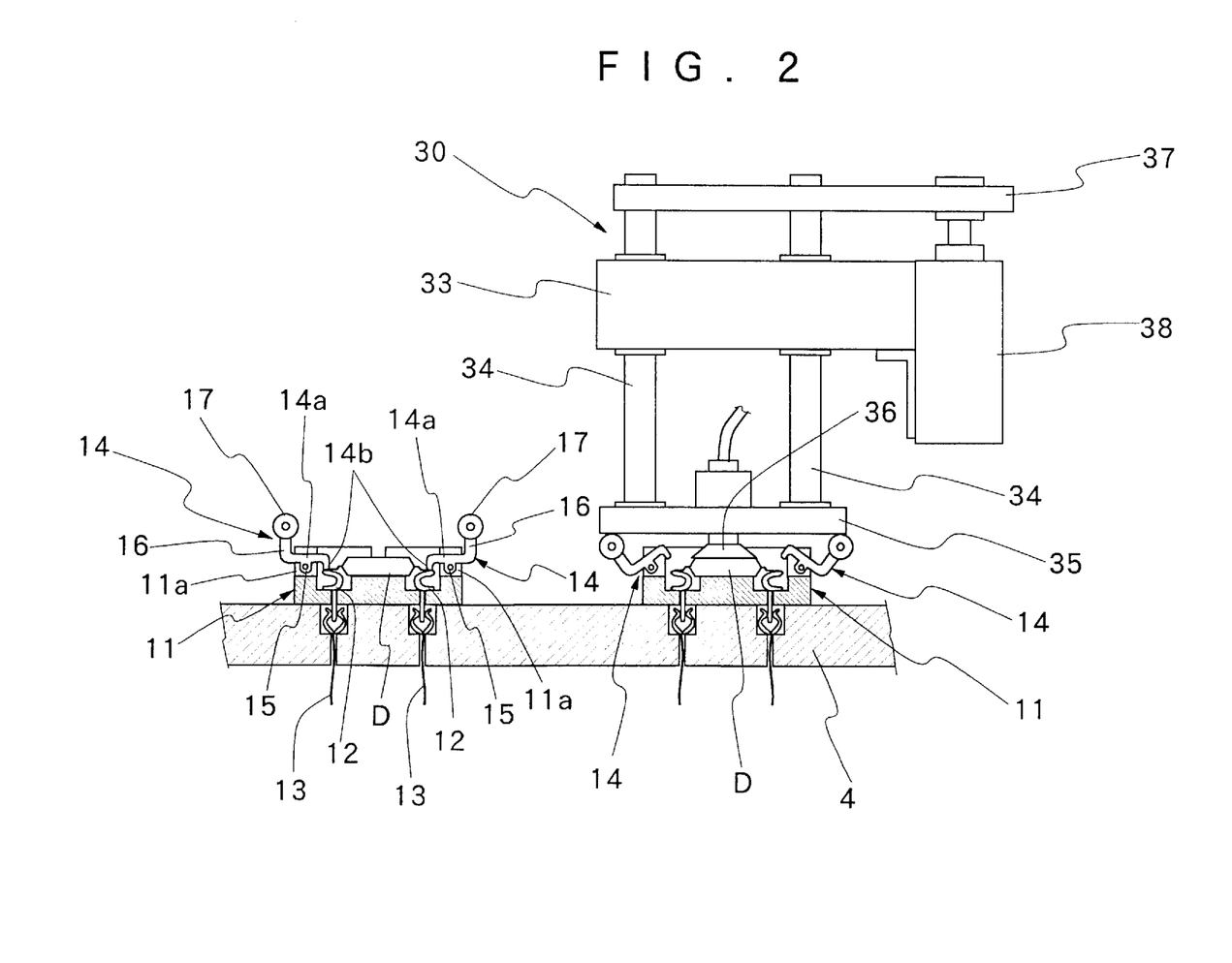
FIG. 2 is a schematic sectional view of an IC device transfer means and a test board which are employed by the testing apparatus of FIG. 1, showing also IC devices which are mounted on the test board.

Shown in FIG. 1 is the general layout of an IC device testing apparatus according to the present invention, while shown in FIG. 2 is the construction of a test board having a number of packaged IC devices mounted thereon for a test of electrical properties. In these figures, indicated at 1 is a loader section or loading station, at 2 an unloader section or loading station and at 3 a thermostatic chamber. Provided within the thermostatic chamber 3 are a testing station with a test board 4, an inward IC feed conveyer 5 and an outward IC discharging conveyer 6. Further, an in-chamber transfer robot 7 is provided in the thermostatic chamber for transferring IC devices D to and from the test board 4. A large number of IC holder trays 8 are stacked at the loading station 1. A loader robot 9 is provided at the loading station 1 thereby to pick up IC devices D from an IC holder tray 8 and transfer them onto the inward conveyer 5. A number of IC holder trays 8 are also provided at the unloading station 2. Namely, at the unloading station 2, tested IC devices D are sorted into a number of classes by the use of a corresponding number of trays 8. Further, an unloader robot 10 is provided at the unloading station 2 thereby to pick up tested IC devices D which have been delivered to the unloading station by the outward conveyer 6, and transfer them onto the classified trays 8. In this instance, initially the trays 8 at the unloading station are in an empty state while the trays 8 in the loader section 1 are each loaded with a predetermined number of IC devices D.

Provided on the test board 4 are a large number of contacting sockets 11, for example, 32, 64 or 128 sockets 11 which are arrayed in a matrix-like fashion. IC devices to be tested are removably set in these sockets 11. Each socket 11 is provided with 12 contact points 12 in corresponding positions with respect to lead portions of the packaged IC device. These contact points 12 are electrically connected to the IC tester, which is not shown, through wiring 13 or a wiring board. Accordingly, as soon as an IC device D is set in a socket 12, a predetermined test program is executed by the IC tester, including a data write-in and read-out test according to a preset algorithm and a data erasure test. Thus, the test board 4 functions not only as a support for the sockets 11 but also as an interface board for the IC tester.

The IC tester executes a predetermined test program separately with respect to each one of the sockets 11 on the test board 4, so that all of IC devices D in the sockets 11 are tested concurrently and independently of each other. However, there is no necessity for running the test program on the respective IC devices in step with each other. Therefore, there can be situations where, while a data write-in test is under way with respect to a certain socket 11, a data erasure test is concurrently conducted with respect to another socket 11 or a data write-in or erasure test to or from different addresses is conducted with respect to a socket in a different position.

Figure 3:
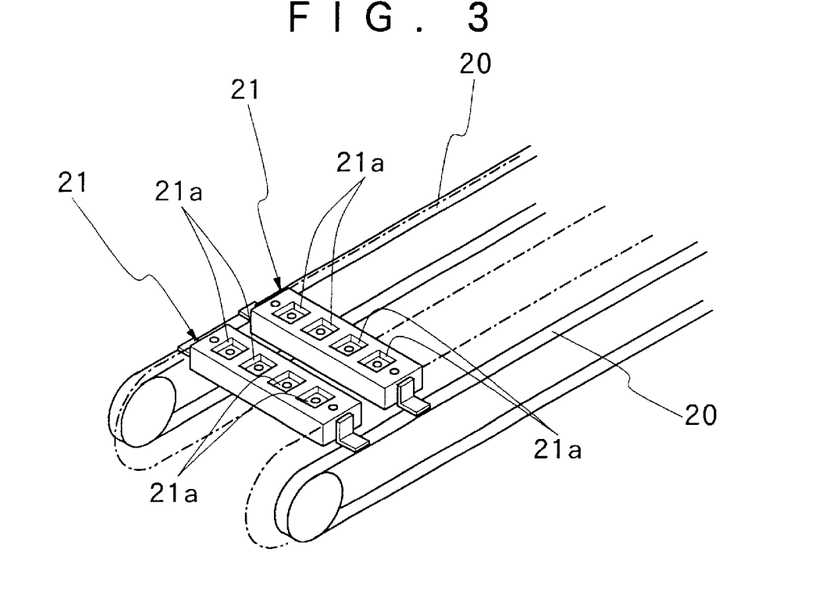
FIG. 3 is a schematic perspective view of a feeder conveyer.

In this instance, IC devices D are fed separately to the respective contacting sockets 11 which are provided on the test board 4. For this purpose, IC devices D on a tray 8 at the loader section 1 are put on the inward conveyer 5 and thereby transferred to a position where they can be picked up by the in-chamber transfer robot 7. For example, the inward conveyer 5 can be arranged as shown in FIG. 3. As seen in that figure, the inward conveyer 5 is constituted by a chain conveyer having pair of endless chains 20 located at a predetermined distance from each other in a transverse direction, and a large number of device carrier blocks 21 which are supported on and across the endless chains 20 and successively in the IC device transfer direction of the chain conveyer.

The device carrier blocks 21 are each provided with a plural number of IC holder pockets 21a (four IC holder pockets 21a in the particular example shown) in a row in a direction perpendicular to the IC device transfer direction by the chain conveyers 20. The just-mentioned chain conveyer 20 serves to transfer IC devices D to a position within the thermostatic chamber 3, which is indicated by a letter S in FIG. 1, from a position outside of the thermostatic chamber 3. On the other hand, the loader robot 9 functions to transfer IC devices D into the respective holder pockets 21a of the device carrier blocks 21 outside the thermostatic chamber 3.

As the chain conveyer 20 is actuated, the device carrier blocks 21, each loaded with IC devices D in the holder pockets 21a, are successively transferred into the thermostatic chamber 3. As soon as a leading carrier block 21 reaches the predetermined position S within the thermostatic chamber 3, the IC devices D on the carrier block 21 are picked up by the transfer robot 7 and put in the sockets 11 on the test board 4. At this time, in order to let the transfer robot 7 put the respective IC devices correctly and accurately in position within the sockets 11, it is preferable for the IC devices D in the holder pockets 21a to be already in a roughly oriented position. For this purpose, it is preferred to provide a tapered guide surface at the upper end of each holder pocket 21a so that IC devices D can be roughly oriented into position when they are transferred from the loading station 1. The outward conveyer 6 is substantially same as the inward conveyer 5 in construction and therefore its details are omitted here and in the drawings.

Figure 4:
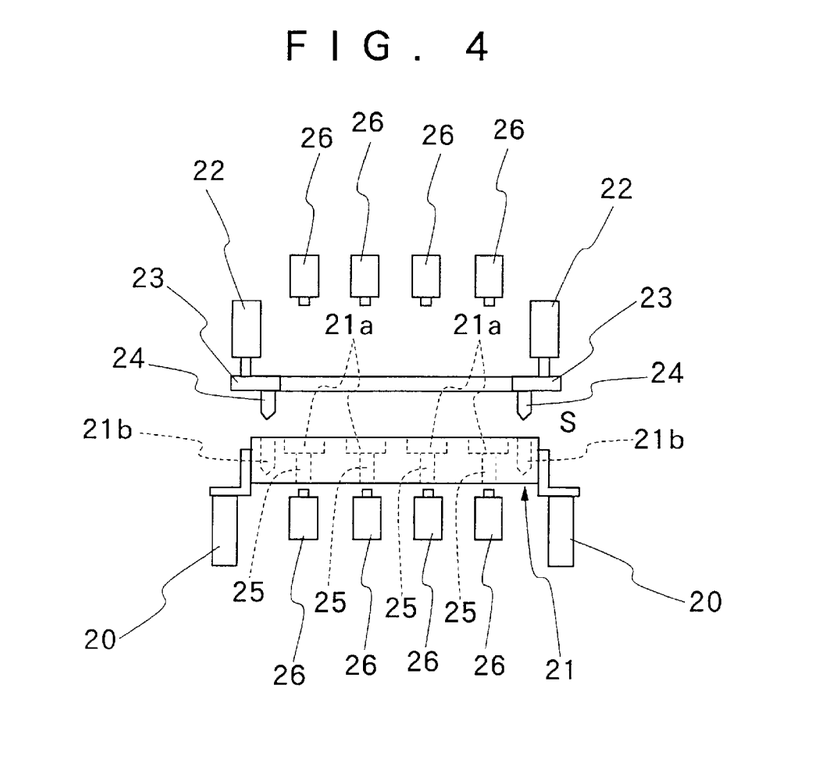
FIG. 4 is a schematic illustration explanatory of transfer positions in an IC device transfer path of the feeder conveyer.

In this instance, the inward conveyer 5 is arranged to transfer IC devices D over a predetermined distance within the thermostatic chamber 3. Therefore, while being transferred through a predetermined distance by the inward conveyer 5 within the thermostatic chamber, the IC devices on the carrier block 21 can heated or cooled to a predetermined testing temperature. That is to say, the inward conveyer 5 also has a function of preheating IC devices D to be tested. As soon as a carrier block 21 reaches the transfer position S, IC devices D in the holder pockets 21a of the carrier block 21 are picked up and put in the sockets 11 on the test board 4 by the transfer robot 5. Provided at the transfer position S is a block positioning mechanism for positioning the carrier block 21 in a predetermined transfer position. More particularly, as shown in FIG. 4, the block positioning mechanism is constituted by a positioning plate 23 which is lifted up and down by cylinders 22 or other drive means, and positioning pins 24 which are pendant from opposite end portions of the positioning plate 23. On the other hand, pin receiving holes 21b are provided on the side of the device carrier block 21 in confronting positions relative to the positioning pins 24. Accordingly, when the cylinders 22 are actuated to lower the positioning plate 23, the pins 24 are brought into fitting engagement with the pin receiving holes 21b. As a result, the device carrier block 21 is stably retained in a predetermined transfer position, permitting the transfer robot 7 to pick up IC devices D smoothly from the respective holder pockets 21a by the transfer robot 7.

Further, for example, photo sensors are provided at the transfer position S to detect whether or not an IC device exists in the holder pockets 21a of the device carrier block 21. More specifically, a device detection hole 25 is opened in the bottom of each holder pocket 21a, and a light emitting element and a light receiving element of a transmission type photo sensor 26 are located opposingly on the upper and lower sides of the device detection hole 25 of each holder pocket 21a.

The photo sensor 26 serves to detect the position of a holder pocket 21a or positions of holder pockets 21a in which an IC device is accommodated, and at the same time has a function of determining the timing of intermittent or stepwise feed of the inward conveyer 5. Namely, the inward conveyer 5 is fed forward stepwise or intermittently, and stopped at one position while IC devices D are picked up from all of four holder pockets 21a of a device carrier block 21 which is located at the transfer position S. As soon as all of the four holder pockets 21a becomes empty, this is detected by the photo sensor 26 and the inward conveyer 5 is moved forward by one step.

Figure 5:
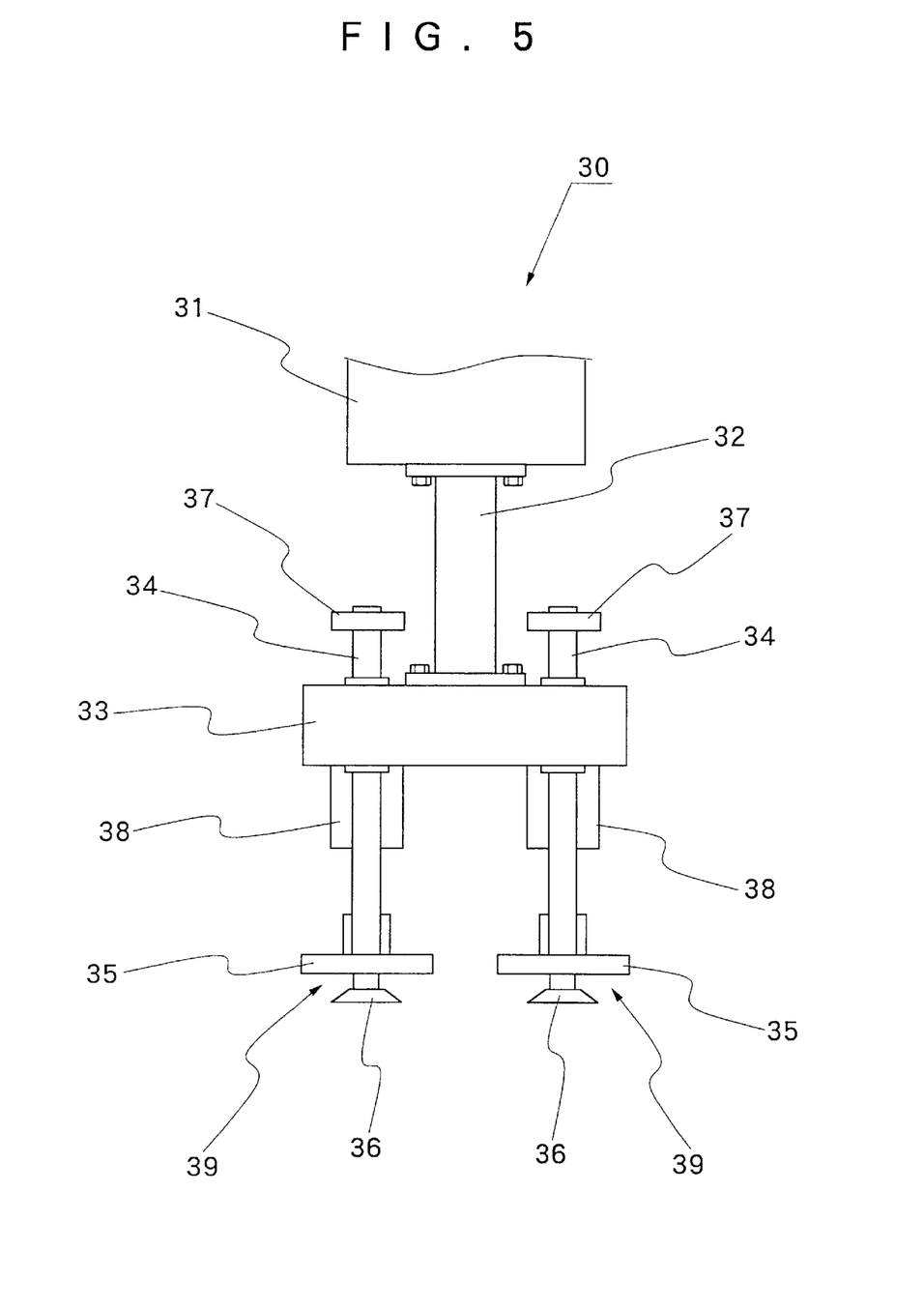
FIG. 5 is a schematic left-hand side view of the IC device transfer means shown in FIG. 2.

Nextly, IC devices D are transferred from the inward conveyer 5 to the sockets 11 of the test board 4 by the inward conveyer 5, after transferring tested IC devices from the test board 4 to the outward conveyer 6. For this purpose, the in-chamber transfer robot 7 is provided with an X-axis arm 7a and a Y-axis arm 7b. As shown in FIGS. 2 and 5, device transfer means 30 are provided on the Y-axis arms 7b for upward and downward movements separately and independently of each other. Each device transfer means 30 is constituted by a support plate 33 which is supported on a lower end portion of a rotational shaft 32 and turned therewith back and forth horizontally through 180 degrees by an actuator 31, which is mounted on the Y-axis arm 7b, a lift plate 35 which is passed through the support plate 33 and moved up and down by a guide rod 34, and a suction nozzle 36 which is provided on the lower side of the lift plate 35. The lift plate 35 is moved up and down by a drive plate 37 which is provided at the fore end of the guide rod 34. The drive plate 37 is connected to a drive means 38 such as a cylinder or the like which is mounted on the support plate 33. In this connection, if desired, it is also possible to make the device transfer means 30 non-rotatable relative to the Y-axis arm 7b but slidable relative to the latter.

Thus, a device transfer unit 39 is constituted by a lift plate 35 with a suction nozzle 36, and a drive plate 37 and a drive means 38 which move the suction nozzle 36 up and down. In the particular embodiment shown, a couple of device transfer units 39 are provided on the support plate 33 in symmetrical positions on the opposite sides of the rotational shaft 32. One of these two transfer units 39 serves to pick up a tested IC device D from the test board 4 while the other one serves to set a fresh or untested IC device D in a socket on the test board 4. As the device transfer means 30 is located in a position over a device carrier block 21 by the in-chamber robot 7, an IC device D is picked up by a suction nozzle 36 of one transfer unit 39. As soon as the device transfer means 30 is displaced to a position confronting the test board 4, firstly the other free suction nozzle 36 is actuated to pick up a tested IC device from a socket 11 of the test board 4, and then the fresh IC device on the first suction nozzle 36 is released and put in a socket 11 of the test board 4. The device transfer means 30, with a couple of transfer units 39 as described above, can be provided in a plural number of positions on the in-chamber robot 7.

As described above, according to the present invention, the device transfer mechanism includes at least one in-chamber robot 7 and a device transfer means 30 with a couple of transfer units 39. In addition, in the particular embodiment described above, the loader robot 9 is employed at the loading station 1 to transfer IC devices D onto device carrier blocks 21 on the inward conveyer 5. However, if desired, the trays 8 can be utilized as a transfer jig. Further, in case the thermostatic chamber is omitted, device transfer means can be provided directly on the loader robot. In short, the above-described device transfer mechanism is a mechanism with suction nozzles for transferring IC devices into the sockets 11 of the test board.

At the time when IC devices D are transferred to and put in, the sockets 11 on the test board 4, the respective lead portions of the IC devices have to be brought securely into contact with the corresponding contact points on the side of the sockets 11. For this purpose, as shown in FIG. 2, each contact point 12 is constituted by a resilient member, and clamp members 14 are provided in opposite lateral side walls of the socket 11 thereby to press lead portions of packaged IC devices into contact with the respective contact points 12. Then, the clamp members 14 need to be released at the time of transferring IC devices D again. To this end, each clamp member 14 is constituted by a rocking plate 14a which is rockably supported on a lateral side all of the socket 11 through a pin 15 at its intermediate portion, and a clamping pawl 14b which is provided at the inner end of the rocking plate 14a for abutting engagement with lead portions of an IC device D. An operating arm 16 which is projected upward from the other outer end of the rocking plate 14a is provided with a roller 17 at its distal end. Further, although not shown in the drawings, the rocking plate 14 is constantly biased by a spring in a direction of pressing the clamping pawl 14b toward the contact points 12. Accordingly, as soon as an IC device D is set in a socket 11, lead portions of the IC device are pressed against and securely held in contact with corresponding contact points 12 by the clamp member 14.

The clamping action of the clamp member 14 has to be cancelled at the time of putting an IC device on and off the socket 11. The transfer unit 39 of the device transfer means 30 is provided with the lift plate 35 with the suction nozzle 36 on the lower side thereof. As the lift plate is lowered by the drive means 38, the lower side of the lift plate 35 is brought into abutting engagement with the roller 17. Whereupon, the clamp member 14 is caused to turn about the pin 15 retracting the clamping pawl 14b away from the upper opening of the socket 11.

Accordingly, in relation with a downward movement of the lift plate 35 of the transfer unit 39, the top side of the socket 11 is opened up, permitting the suction nozzle 18 of the transfer unit 39 to pick up an IC device D therefrom. Then, in relation with an upward movement of the lift plate 35, the clamp member 14 is released and lead portions of an IC device which has been put in the socket 11 are clamped against corresponding contact points 12 and securely held in contact with the latter by the clamp member 14. Thus, the lead portions of the IC device are electrically connected to the contact points 12 securely by a pressing force acting in a direction of resiliently deforming the contact points 12. On the other hand, when the lift plate 35 is lowered to pick up an IC device D from the socket 11, the clamp member 14 is turned into the retracted position to release the IC device D, and then the lower gripping end of the suction nozzle 18 is brought into engagement with the top side of the IC device. As a result, a package portion of the IC device D is gripped by the suction nozzle 18 and picked up from the socket 11.

Figure 6:
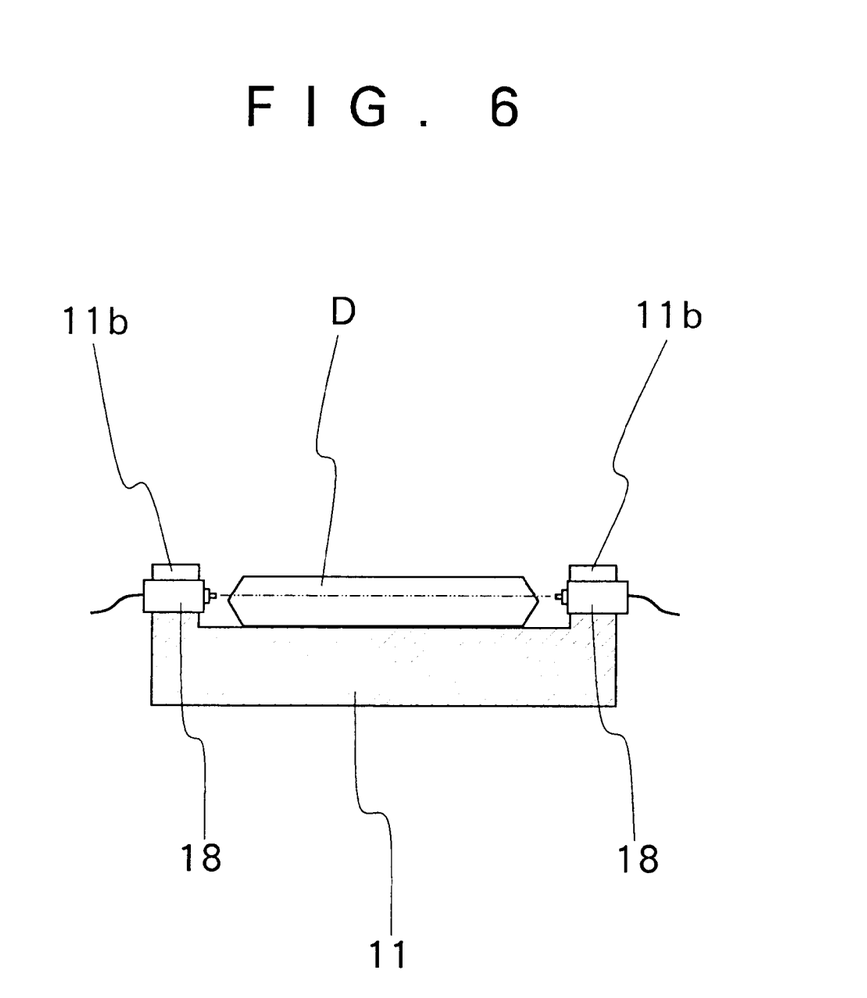
FIG. 6 is a schematic view of a photo sensor which is provided in a socket.

Presence or absence of an IC device in a socket 11 is detected by the light transmission type photo sensor 18 which is provided between the lateral side walls 11b of the socket 11 as shown in FIG. 6. For detection of an IC device in the socket 11, there may be employed the so-called suction sensor, detecting presence of an IC device from the pressure in the suction nozzle 36 in place of the above-described photo sensor. Namely, in the case of the suction sensor, whether or not an IC device is in the socket 11 is detected from the internal pressure of the suction nozzle 36 which remains at a negative pressure level when an IC device is still gripped on the suction nozzle 36 and rises to the atmospheric pressure or near the atmospheric pressure as soon as the IC device is released and put in the socket 11.

With the IC device testing apparatus according to the present invention, having the above-described arrangements, electrical properties of IC devices can be tested efficiently in the manner as follows.

Firstly, in a preparatory stage leading to a testing stage, IC devices are heated or cooled to a predetermined testing temperature. Namely, IC devices to be tested are imparted with predetermined temperature conditions by and in the thermostatic chamber 3. The inside of the thermostatic chamber 3 is maintained at a specified temperature, while IC devices D are successively put in holder pockets 21a of a device carrier block 21. This operation is performed by the loader robot 9, and, as soon as one carrier block 21 is loaded with IC devices in the respective holder pockets 21a, the inward conveyer 20 is fed forward until a foremost one of loaded carrier blocks 21 reaches the afore-mentioned transfer position S. In the meantime, the loader robot 9 continues to transfer IC devices D onto a new carrier block 21.

The IC devices in the holder pockets 21a of the foremost carrier block 21 at the transfer position S are stopped there and held in a standby state until they reaches the predetermined testing temperature. Then, the in-chamber transfer robot 7 is actuated to pick up IC devices D successively from the carrier blocks 21 and transfer them into the sockets 11 on the test board 4, followed by initiation of a test on each one of the IC devices D on the test board 4. In the meantime, as all of IC devices D are evacuated from a carrier block 21, the chain conveyer 20 is fed forward by one pitch to advance a next carrier block 21 to the transfer position S. Thus, the IC devices on the second carrier block 21 are now in a position for transfer to the test board 4. The transfer of IC devices D from a carrier block 21 to the test board 4 is continued until all of the sockets 11 on the test board 4 are loaded with an IC device D.

Transfer of an IC device D to a socket 11 of the test board 4 is detected by the photo sensor 18 which is provided in each socket 11. A detection signal from a photo sensor 18 of a socket 11 is fed to the IC tester as a trigger signal for starting a test for an IC device D in that particular socket 11. Accordingly, IC tests are started one after another in step with the transfer of IC devices D to the sockets 11 on the test board 4. If desired, the start of IC tests may be postponed until all of the sockets 11 on the test board 4 are loaded with an IC device. However, from the standpoint of conducting IC tests efficiently and speedily, it is desirable to start a test as soon as an IC device is put in one of the sockets 11 of the test board 4.

Figure 7:
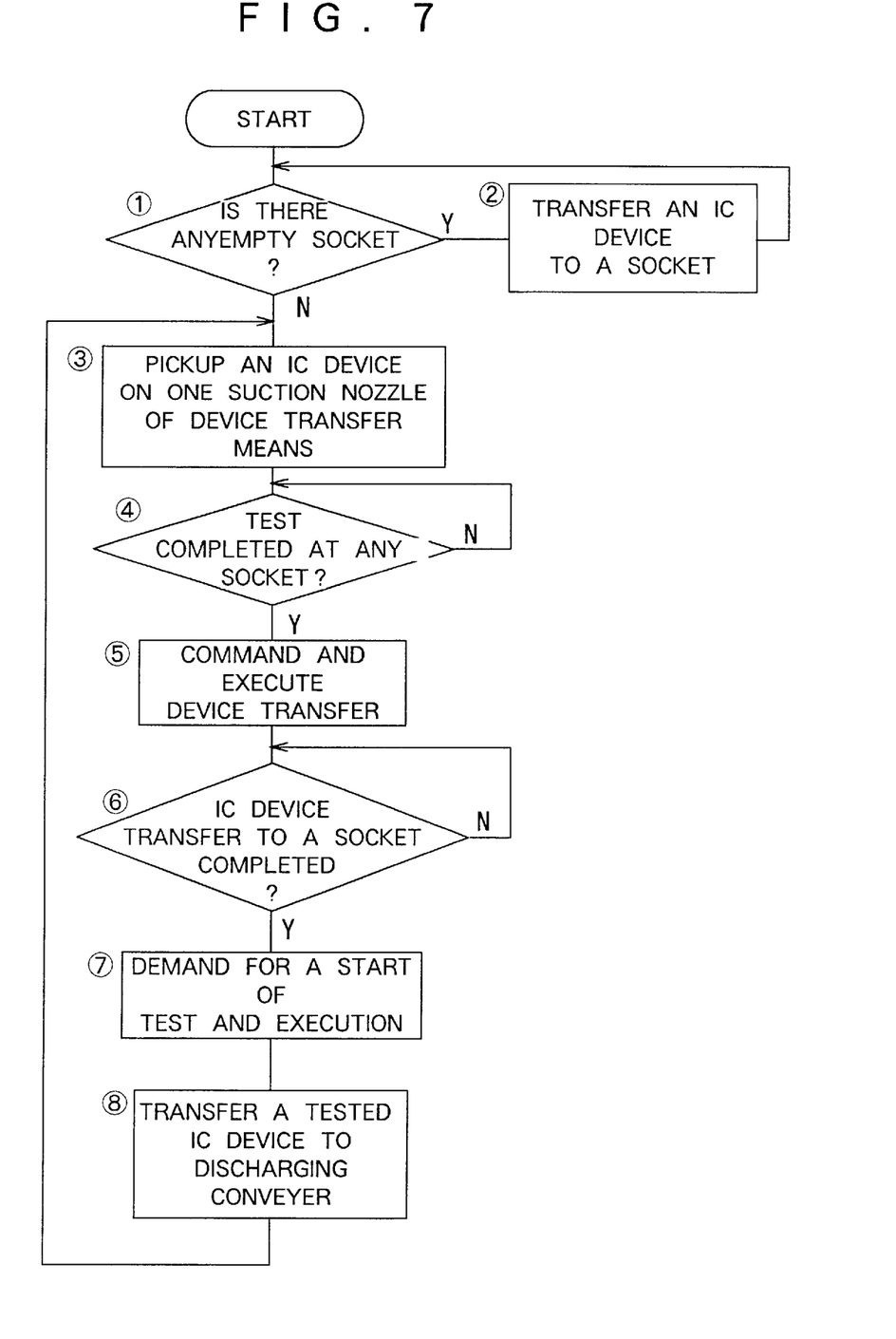
FIG. 7 is a flow chart of an IC device testing procedure which is executed by the IC device testing apparatus according to the present invention.

It follows that execution of a test program is already in progress with respect to a certain number of sockets 11 at latest at a time point when IC devices are transferred to and put in all of the sockets 11 on the test board 4. For example, an IC test is conducted according to the procedural steps as shown in FIG. 7.

As clear from that figure, firstly a check is made as to whether or not there is an empty socket 11 on the test board 4 (Step 1). If there is an empty socket 11, the device transfer means 30 is actuated to transfer an IC device D to the empty socket 11 (Step 2). When all of the sockets 11 on the test board 4 is loaded with an IC device D, the device transfer means 30 is moved to and located at the transfer position S of the inward conveyer 5 and allowed to stand by there after picking up one IC device D from a device carrier block 21 (Step 3). The device transfer means 30 is held in the standby state until an IC test is completed at any one of the sockets 11 on the test board 4. As soon as a test is completed at one of the sockets 11 (Step 4), a command signal is dispatched to the transfer means to replace the tested IC device at that socket 11 by a fresh IC device D (Step 5).

A tested IC device is replaced in the manner as follows. In the first place, the device transfer means 30 is moved to a position over a tested IC device D. Of the two transfer units 39, a free transfer unit 39 (with no IC device D) is located over a target socket 11 and then lowered to pick up a tested IC device D by its suction nozzle 36. In this state, the support plate 33 is turned through 180 degrees (or slid to switch the position of the transfer units), positioning the suction nozzle 36 with a fresh IC device D over the socket 11. Then, the lift plate 35 is lowered to put the fresh IC device D in the socket 11.

The placement of a fresh IC device D in the socket 11 is detected by the photo sensor 18. Namely, the placement of the fresh IC device D in the socket 11 is checked by a detection signal from the photo sensor 18 (Step 6). As a consequence, a command signal is dispatched to the IC tester to start a test and execute a test program for that socket 11 (Step 7). In the meantime, the device 30 is moved toward the outward conveyer 6 to transfer thereonto the tested IC device D which has been gripped on the suction nozzle 36 of one of the transfer units 39 of the device transfer means 30 (Step 8). Thereafter, the control returns to Step 3, in which the device transfer means 30 is operated to pick up one IC device D on one transfer unit and held in a standby state until a test is completed at another socket 11. The foregoing operations are repeated to test a large number of IC devices successively and continuously.

Figure 8:
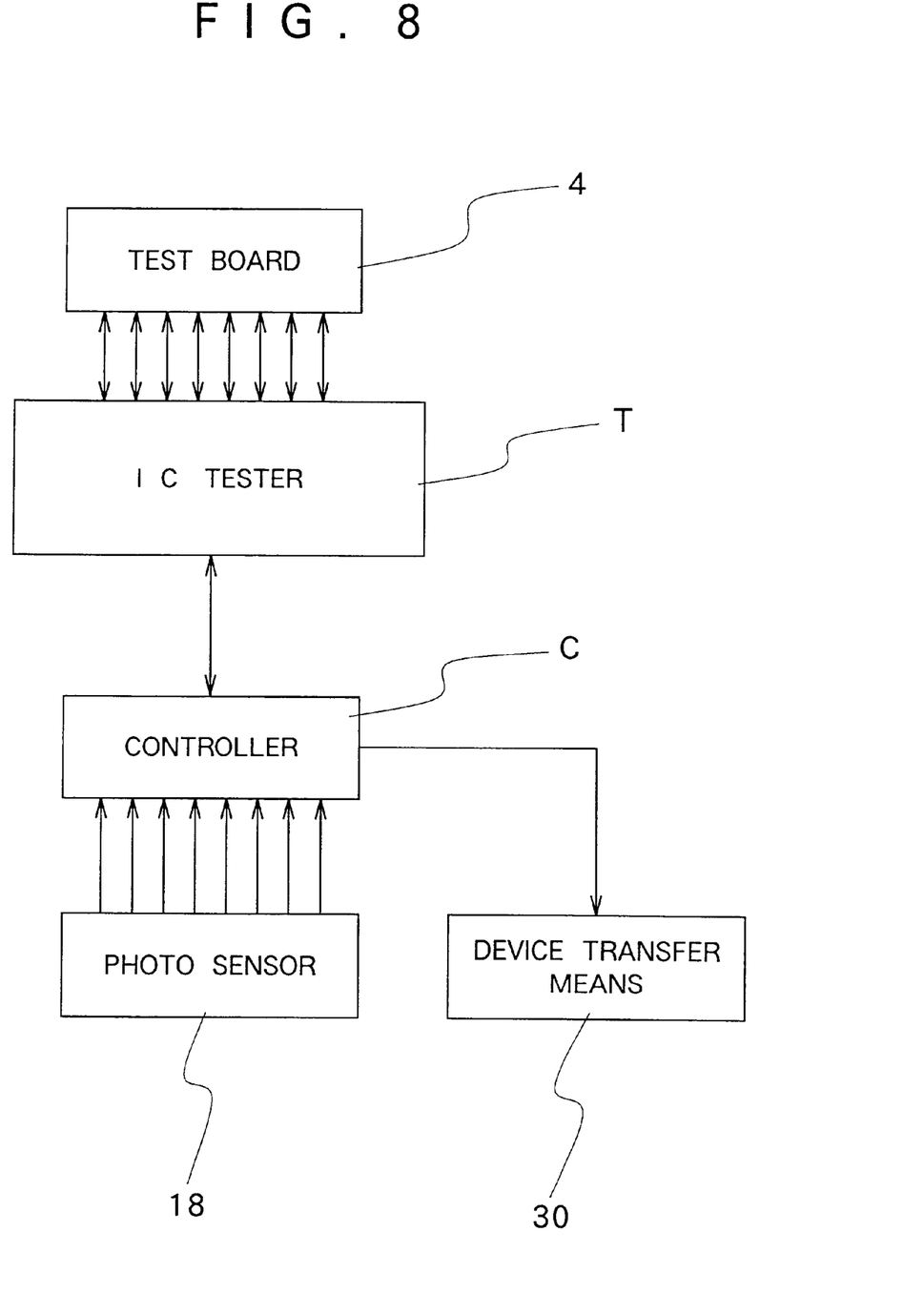
FIG. 8 is a block diagram of a controller which controls operations of the IC device testing apparatus.

For example, the above-described steps of a test routine can be executed and controlled by the use of a circuit which is diagrammatically shown in FIG. 8. In that figure, indicated at T is an IC tester, and at C a controller. When conducting tests concurrently on a number of IC devices, signals are dispatched to and from the IC tester T and the respective sockets 11 on the test board 4. In doing so, signals are sent to and from the respective sockets 11 separately and independently of each other. For example, in the case of FIG. 8 where eight sockets 11 are provided on the test board, a signal cable contains eight signal lines to connect the respective sockets 11 with the tester T separately and independently of each other. In the case of a tester with 64 (sixty-four) sockets 11, 64 signal lines are separately and independently connected to the sockets 11. The controller C functions to control the operations of the device transfer means 30 and also to dispatch test start command signals to the tester T.

Accordingly, each time when an IC test is completed at one of the sockets 11, a signal is dispatched from the tester T to the controller C to drive the device transfer means 30 into an action for replacing the tested IC device D. The IC tester T therefore constitutes a means for detecting completion of a test on each one of the IC devices D in the respective sockets 11 of the test board 4. On the other hand, the controller C constitutes a means for driving the device transfer means 30 into action in response to a signal from the tester T. Thus, the device transfer means 30 and the in-chamber robot 7, on which the device transfer means 30 is mounted, are put in action according to 11 drive signals from the controller C to execute predetermined procedural steps. Further, presence or absence of an IC device in each socket 11 is detected by the light transmission type photo sensor 18 which is provided in each socket 11, because transmitted light from a light emitting element of the sensor is blocked when an IC device D is present in a socket 11 and passed through to a light receiving element when an IC device is absent. Accordingly, the controller C constantly checks for a signal from the light receiving element which is indicative of the level of received light, which turns from H to L when an IC device D is put in a socket 11. Whereupon, a test start command signal is dispatched from the controller C to the tester T to start execution of a test program for that socket 11. Accordingly, the photo sensors 18 constitute means for detecting placement of an IC device to be tested, in the respective sockets 11 on the test board. Upon receiving a test start command signal with respect to a particular socket 11, actually the tester T starts a test on an IC device in that socket 11 with a predetermined time lag.

Figure 9:
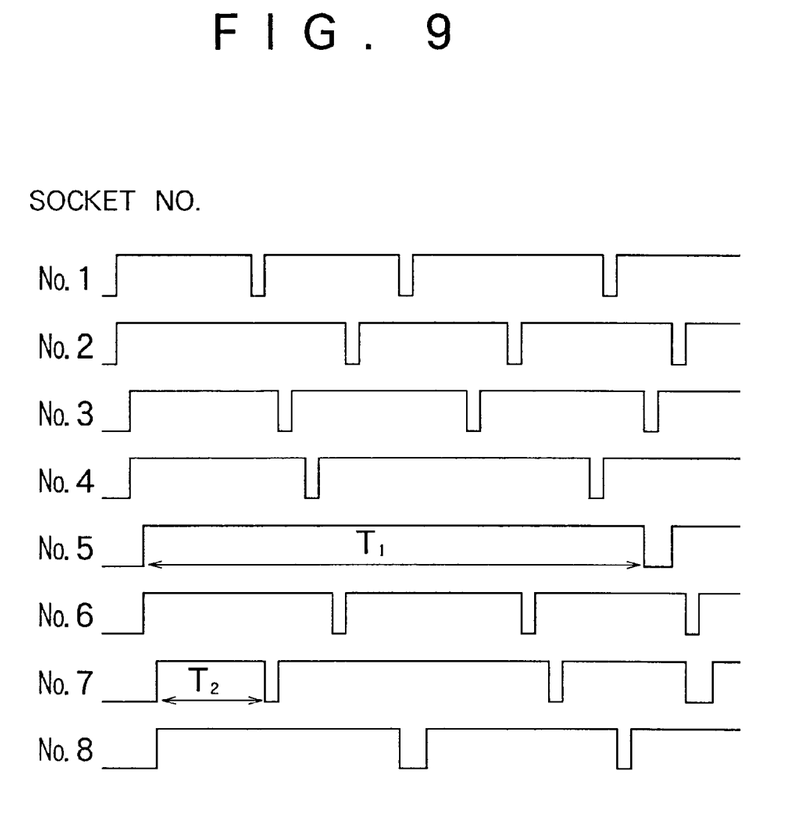
FIG. 9 is a test cycles timing chart.

By execution of the procedural steps as described above, a large number of IC devices D are tested successively and continuously. In a case where the test board 4 is provided with eight sockets 11 thereon, for example, IC devices D in the respective sockets 11 are tested in the timing as shown in FIG. 9. As seen in that figure, the test board 4 is provided with sockets No. 1 to No. 8. For the convenience of illustration, an IC device test time period is indicated by a level H and an IC device transfer period is indicated by a level L. In the case of the sockets shown in that figure, the test time varies from one socket to another, taking a longest time period $T_1$ at the socket No. 5 and a shortest time period $T_2$ at the socket No. 7. In this manner, there inevitably occur large variations in test time among the respective sockets on the test board. However, as soon as a test is completed, IC devices in the respective sockets are immediately replaced by a fresh IC device substantially without a waiting time. Therefore, thanks to an extremely high operating efficiency of the apparatus, a large amount of IC devices can be tested efficiently and continuously within a remarkably shortened test time.

In some cases, An IC test may end simultaneously at a number of sockets. In such a case, the controller C is operated to replace tested IC devices successively according to a preset preferential order of the sockets. For instance, in the case of the particular example shown, a second test at the socket No. 1 and a first test at the socket No. 8 end simultaneously. In this case, a tested IC device D at the socket No. 1 is replaced prior to a tested IC device at the socket No. 8. Though the IC device D on the socket No. 8 is replaced after a short waiting time, the replacement itself can be completed within a short period of time without causing any substantial losses in time. In this regard, a plural number of similar device transfer means 30 can be provided on the in-chamber robot 7 in order to shorten the waiting time.

What is claimed is:

1. An apparatus for successively testing electrical properties of a large number of packaged IC devices, including:

a test board provided at a testing station and provided with a plural number of sockets for receiving therein plural IC devices for connection to an IC tester separately and independently of each other, a loader located at a loading station and adapted to feed untested IC devices toward said test board, an unloader located at an unloading station and adapted to discharge tested IC devices from said test board at said testing station, and a device transfer mechanism movable across said testing station to transfer untested IC devices from said loader to said testing station and to transfer tested IC devices from said testing station to said unloader, said apparatus comprising:

detection means adapted to detect completion of an IC test conducted on an individual IC device in each respective socket of said test board;

means for operating said device transfer mechanism in such a way as to pick up an individual tested IC device from said socket and to replace said individual tested IC device with a fresh individual IC device yet to be tested; and means for individually detecting placement of said fresh individual IC device in said socket of said test board.

2. An apparatus for successively testing electrical properties of a large number of packaged IC devices as defined in claim 1, wherein said device transfer mechanism is provided with a device transfer means with a set or sets of suction heads for gripping package portions of said IC devices, including:

a first suction head for picking up a tested IC device from a socket of said test board; and a second suction head for transferring a fresh IC device into an empty socket of said test board.

3. An apparatus for successively testing electrical properties of a large number of packaged IC devices as defined in claim 1, wherein:

said testing station is provided within a thermostatic chamber to test electrical properties of said IC devices at a predetermined temperature.

4. An apparatus for successively testing electrical properties of a large number of packaged IC devices as defined in claim 3, wherein said loading station further includes, alongside said loader:

an inward conveyer configured to feed a plural number of untested IC devices successively on device carrier blocks toward said testing station, traveling over a predetermined distance within said thermostatic chamber to preheat said IC devices.

5. A method for successively testing electrical properties of a large number of packaged IC devices, comprising:

successively picking up untested IC devices fed from a loading station by means of a device transfer mechanism and feeding said IC devices successively to plural sockets on a test board of a testing station for connection to an IC tester;

conducting a test on each one of said IC devices in said sockets in said testing station concurrently and independently of each other;

detecting completion of a test at each individual socket separately;

upon detecting completion of said test at said individual socket, replacing an individual tested IC device in that individual socket with an untested fresh individual IC device by means of said device transfer mechanism; and upon detecting placement of said fresh individual IC device in said socket, starting again a test at said individual socket concurrently with and independently of other tests at other sockets.

* * * * *